(12) United States Patent
Jia et al.

(10) Patent No.: US 9,245,072 B2
(45) Date of Patent: Jan. 26, 2016

(54) SYSTEM AND METHOD FOR PRUNING AN OVER-DEFINED SYSTEM MODEL

(71) Applicant: Huawei Technologies Co., Ltd., Shenzhen (CN)

(72) Inventors: Ming Jia, Ottawa (CA); Hosein Nikopour, San Jose, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 299 days.

(21) Appl. No.: 13/732,173

(22) Filed: Dec. 31, 2012

(65) Prior Publication Data

US 2014/0188444 A1 Jul. 3, 2014

(51) Int. Cl.
*G06F 7/60* (2006.01)
*G06F 17/50* (2006.01)

(52) U.S. Cl.
CPC .................................. *G06F 17/5036* (2013.01)

(58) Field of Classification Search
CPC ............................. G06F 17/5009; H03F 1/3247
USPC .................................... 703/2; 455/114.3, 63.1
See application file for complete search history.

(56) References Cited

U.S. PATENT DOCUMENTS

| 7,847,631 | B2 * | 12/2010 | Jiang | H03F 1/3247 330/149 |
| 8,354,884 | B2 * | 1/2013 | Braithwaite | H03F 1/3247 330/149 |
| 2005/0009479 | A1 * | 1/2005 | Braithwaite | 455/114.3 |
| 2005/0190857 | A1 * | 9/2005 | Braithwaite | 375/296 |
| 2008/0130788 | A1 * | 6/2008 | Copeland | 375/297 |
| 2009/0240917 | A1 * | 9/2009 | Fitton | G06F 17/16 712/36 |

OTHER PUBLICATIONS

Ding, L., et al., "A Robust Digital Baseband Predistorter Constructed Using Memory Polynomials," IEEE Transactions on Communications, vol. 52, No. 1, Jan. 2004, pp. 159-165.
Guan, L., et al., "Optimized Low-Complexity Implementation of Least Squares Based Model Extraction for Digital Predistortion of RF Power Amplifiers," IEEE Transactions on Microwave Theory and Techniques, vol. 60, No. 3, Mar. 2012, pp. 594-603.
Tu, Z., "Multiuser Diversity for a Dirty Paper Approach," IEEE Communications Letters, vol. 7, No. 8, Aug. 2003, pp. 370-372.
Younes, M., et al., "An Accurate Complexity-Reduced "PLUME" Model for Behavioral Modeling and Digital Predistortion of RF Power Amplifiers," IEEE Transactions on Industrial Electronics, vol. 58, No. 4, Apr. 2011, pp. 1397-1405.
Zhou, D., et al., "Novel Adaptive Nonlinear Predistorters Based on the Direct Learning Algorithm," IEEE Transactions on Signal Processing, vol. 55, No. 1, Jan. 2007, pp. 120,133.

\* cited by examiner

*Primary Examiner* — Omar Fernandez Rivas
*Assistant Examiner* — Iftekhar Khan
(74) *Attorney, Agent, or Firm* — Slater & Matsil, L.L.P.

(57) ABSTRACT

Methods and apparatuses are provided to select coefficients for modeling a system. Data collected from the system is used to generate a data matrix. An upper triangular matrix can be generated in accordance with the data matrix, and the upper triangular matrix can be pruned to remove selected rows and columns from the upper triangular matrix, thereby generating a pruned data matrix. A coefficient vector can be generated in accordance with the pruned data matrix. Various alternative methods of selecting coefficients for modeling the system, as well as apparatus, devices, and systems for performing said methods, are also provided.

24 Claims, 7 Drawing Sheets

US 9,245,072 B2

SYSTEM AND METHOD FOR PRUNING AN OVER-DEFINED SYSTEM MODEL

TECHNICAL FIELD

The present invention relates generally to system modeling, and more particularly to techniques for using regression analysis to prune over-defined systems.

BACKGROUND

Linear regressive modeling is a technique used to describe systems using a set of linear equations that share common variables, and has a variety of applications in modern communication networks. For instance, linear regressive modeling is used by digital pre-distortion (DPD) circuits to model non-linear characteristics of power amplifiers (PAs). One challenge in linear regressive modeling is to select an appropriate set of coefficients that produces an accurate, yet stable, model of the system. Specifically, if too few coefficients are selected, then the model may become under-defined such that it is incapable of accurately characterizing the system. On the other hand, if too many coefficients are selected, then the model may become over-defined such that it is unstable and/or overly-complex. In a system including a PA and a DPD circuit, an under-defined model may result in poor system linearity (e.g., relatively non-linear relationship between the system's input and output), while an over-defined model may result in an unstable system having a large dynamic range of coefficients. Accordingly, techniques for identifying a set of coefficients that provide tight and stable modeling are desired.

SUMMARY OF THE INVENTION

In accordance with an embodiment, a method of selecting coefficients for modeling a system is provided. The method includes forming a data matrix comprising data collected from the system, and generating an upper triangular matrix in accordance with the data matrix. The method further includes pruning the upper triangular matrix to remove selected rows and columns from the upper triangular matrix, thereby generating a pruned data matrix, and generating a coefficient vector in accordance with the pruned data matrix. In accordance with another embodiment, an apparatus for performing said method is provided.

In accordance with an embodiment, another method of selecting coefficients for modeling a system is provided. The method includes collecting data from the system to form a data matrix, performing column sorting on the data matrix to produce a permutated data matrix, performing QR decomposition on the permutated data matrix to produce an upper triangular matrix, pruning the upper triangular matrix to remove selected rows and columns from the upper triangular matrix, thereby generating a pruned data matrix, and generating a coefficient vector in accordance with a derivative of the pruned data matrix. In accordance with another embodiment, an apparatus for performing said method is provided.

In accordance with an embodiment, a DPD circuit is provided. The DPD circuit comprises a first port coupled to an output of a non-linear PA, a second port coupled to an input of the non-linear PA, a processor, and a computer readable storage medium storing programming for execution by the processor. In embodiments, the programming for execution by the processor includes instructions to form a data matrix comprising data obtained from an output signal received on the first port, generate an upper triangular matrix in accordance with the data-matrix, prune the upper triangular matrix to remove selected rows and columns from the upper triangular matrix, thereby generating a pruned data matrix, determine an inverse distortion signal in accordance with a derivative of the pruned data matrix; and output the inverse distortion signal over the second port, thereby compensating for non-linearity in the non-linear PA.

In accordance with yet another embodiment, a DPD circuit provides a first port coupled to an output of a non-linear PA, a second port coupled to an input of the non-linear PA, a processor, and a computer readable storage medium storing programming for execution by the processor. In various embodiments, the programming for execution by the processor includes instructions to form a data matrix from an output signal received on the first port, perform column sorting on the data matrix to produce a permutated data matrix, perform QR decomposition on the permutated data matrix to produce an upper triangular matrix, and prune the upper triangular matrix to remove selected rows and columns from the upper triangular matrix. In some embodiments, the programming for execution by the processor may further include instructions to determine an inverse distortion signal in accordance with a derivative of the pruned data matrix, and output the inverse distortion signal over the second port, thereby compensating for non-linearity in the non-linear PA.

The foregoing has outlined rather broadly the features of various embodiments to facilitate the readers understanding of the detailed description. Additional features and advantages will be described hereinafter, which form the subject of the claims of the invention. It should be appreciated that the conception and specific embodiments described below may be readily utilized as a basis for modifying or designing other structures or processes for carrying out the same purposes of those embodiments. It should also be realized that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Over-defined models tend to be over-inclusive in that they include at least some coefficients that are substantially correlated (or, in some cases, redundant) with other coefficients, thereby causing the resulting model to be unstable. In severe cases, the underlying data matrix may become singular, which prevents the matrix inversion operations required for obtaining the coefficient vector. Embodiments of this disclosure describe novel and non-obvious techniques for pruning (i.e., removing) redundant/correlated coefficients from an over-defined coefficient vector or set of coefficients, thereby decreasing the degree of co-linearity within the model and reducing the likelihood that the model will become over defined. Although novel aspects of this disclosure are described in the context of DPD circuits, the disclosed aspects are applicable to other modeling disciplines as well.

PAs are used in transmitters to amplify signals prior to transmission in an efficient, yet linear, manner such that substantial gain (i.e., amplification) is achieved without significantly altering frequency characteristics of the resulting signal. Typically, a PA's efficiency is inversely proportional to the PA's linearity, which means that efficient PAs (typically used in transmitters) tend to have inherently non-linear gain characteristics. Non-linear gain characteristics are undesirable insofar as they cause the PA's output signal to be dispersed across adjacent frequency bands, thereby leading to interference and other undesirable signal qualities. In some implementations, PAs may be preceded by DPD, which reduce non-linearity in the PA's output by introducing inverse distortion into the PA's input. To determine the proper amount of inverse distortion to introduce into the PA's input, DPD circuits may need to model the PA's non-linear gain characteristic. Notably, the PA's non-linear gain characteristic is dependent on the PA's input (which is time variant), as well as affected by fluctuations in environmental and/or operating conditions (temperature changes, etc.). As a result, a PA's non-linear gain characteristic is dynamic (i.e., the non-linear input-output relationship changes with respect to time), and therefore challenging to model in an accurate and reliable manner.

Figure 1:
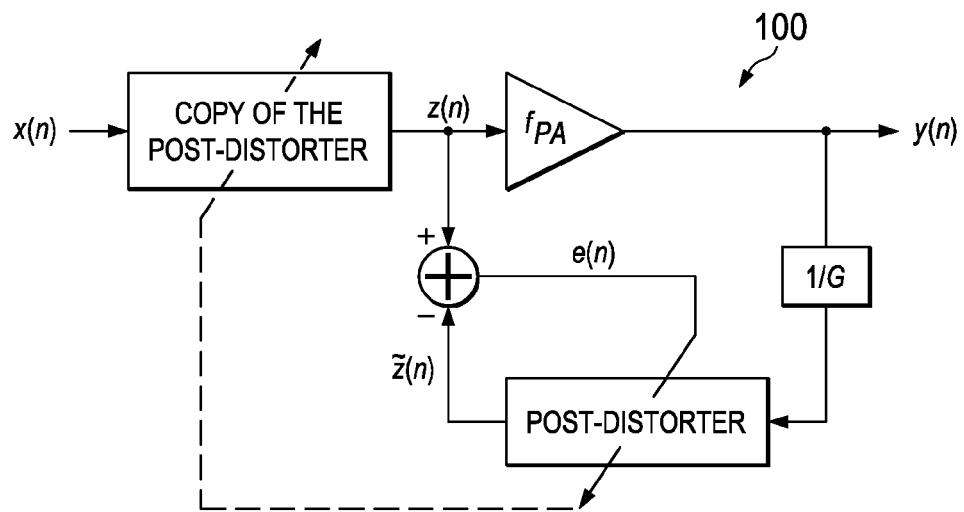
FIG. 1 illustrates a diagram of an indirect learning DPD architecture.
Figure 2:
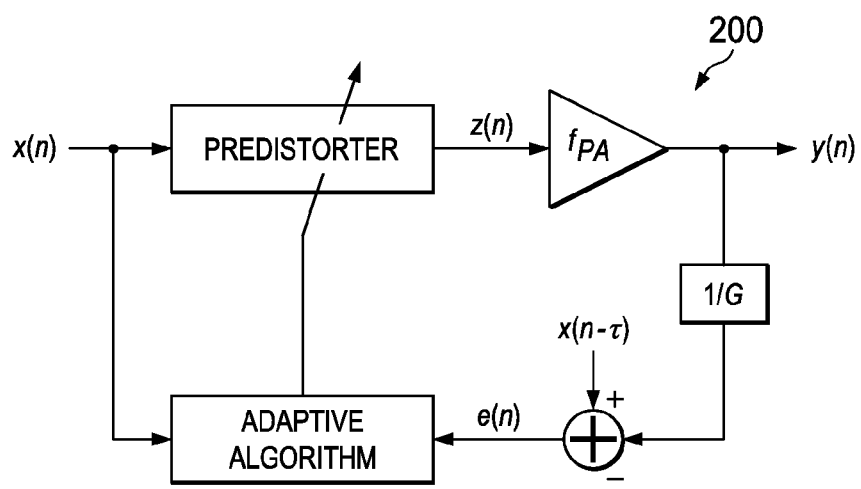
FIG. 2 illustrates a diagram of a direct learning DPD architecture.

DPD circuits may model the PA's non-linear gain characteristic using an indirect learning architecture or a direct learning architecture. FIG. 1 illustrates a block diagram of an indirect learning architecture 100, where a post-distorter is first trained, and then used to predict the inverse distortion signal. FIG. 2 illustrates a block diagram of a direct learning architecture 200, where the inverse distortion signal is obtained by using an adaptive algorithm to train a pre-distorter module. The indirect learning architecture 100 minimizes the error between z(n) and ẑ(n)), while the direct learning architecture minimizes the error between x(n−τ) and y(n).

Techniques for modeling nonlinear systems often rely on multiple regression analysis. In the context of DPD circuits, various regression-based models have been proposed for implementation in the indirect learning architecture 100 and/or the direct learning architecture 200. Such models include the Volterra model, the memory polynomial (MP) model, the envelope MP model, the orthogonal MP model, the generalized MP (GMP) model, and others. Aspects of this disclosure will be discussed in the context of the MP model, but may be equally applicable to the other models as well. In general, the MP model may be defined by the following formula:

$$z_{MP}(n) = \sum_{j=0}^{M_{MP}} \sum_{i=1}^{N_{MP}} c_{ji} x(n-j)|x(n-j)|^{i-1},$$

where x(n) is the input of the model, $z_{MP}(n)$ is the output of the model, $M_{MP}$ is the memory depth of the model, $N_{MP}$ is the polynomial order of the model, and $c_{ji}$ are the coefficients of the model.

Figure 3:
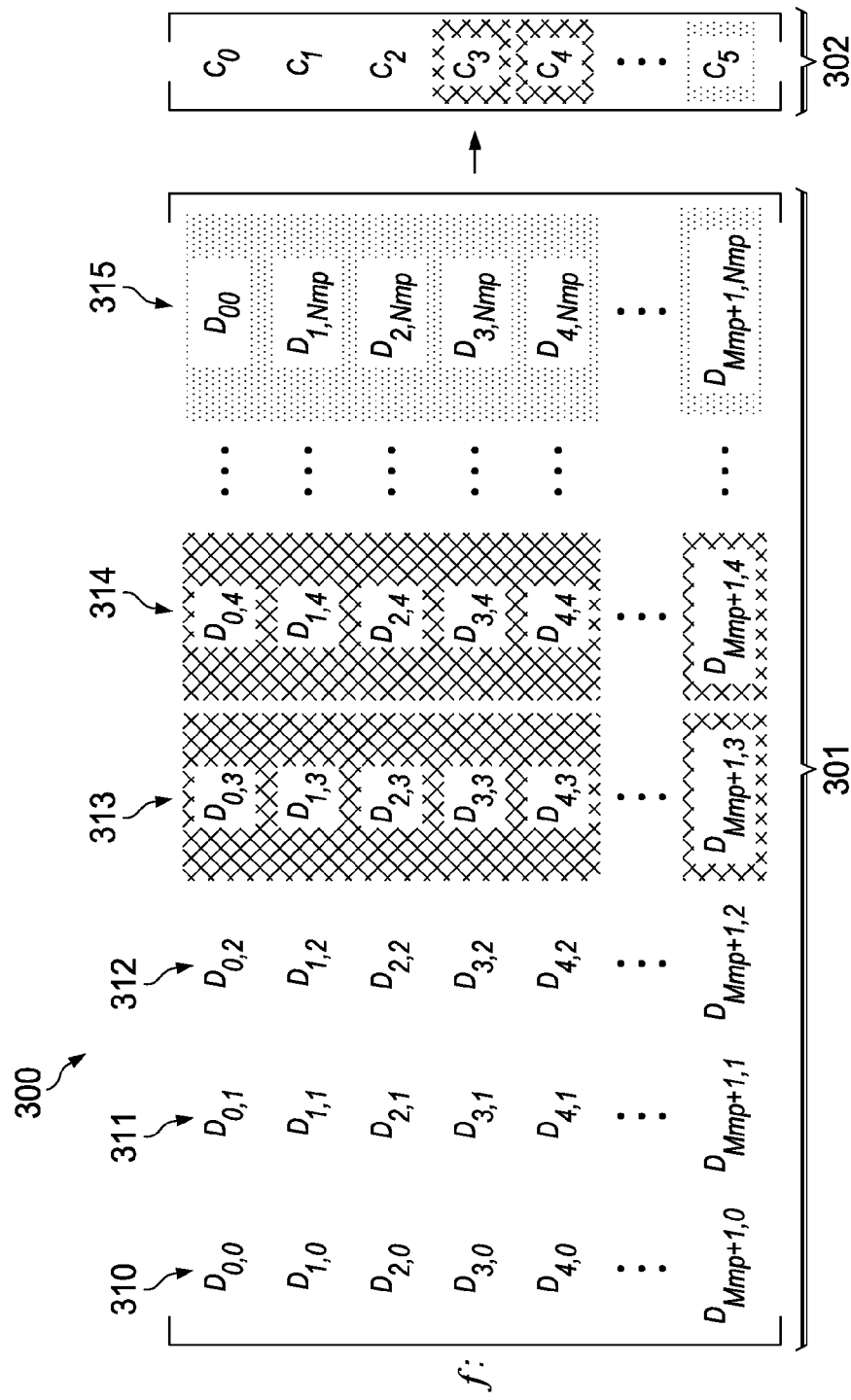
FIG. 3 illustrates a diagram of a data matrix corresponding to a set of coefficients for modeling a system.

Before the MP model is used, a set of coefficients $\{c_{ji}\}$ should be carefully selected such that the coefficient set $\{c_{ji}\}$ includes those coefficients desired for accurate modeling (i.e., ensuring $\{c_{ji}\}$ is not under-defined) without including too many highly-correlated coefficients (i.e., $\{c_{ji}\}$ is not over-defined). A conventional technique for selecting the set of coefficients is to modify the $N_{MP}$ and/or $M_{MP}$ variables to obtain different potential sets of coefficients (e.g., coefficients vectors having different dimensions), and thereafter to evaluate each potential set of coefficients to identify which one provides the most accurate/stable model of the system. FIG. 3 illustrates an example of a data/coefficient pair 300 showing that a function of the data matrix 301 corresponds to a coefficient vector 302 (i.e., $f: R_N \to \vec{c}_k$). As shown, the data matrix 301 may comprise a plurality of columns of data 310-315, and the coefficient vector 302 may comprise a plurality of coefficients $C_0$-$C_5$. Each of the columns 310-315 in the data matrix 301 may correspond to a unique one of the coefficients $C_0$-$C_5$ in the coefficient vector 302. For instance, column 310 may correspond to $C_0$, column 311 may correspond to $C_1$, column 312 may correspond to $C_2$, column 313 may correspond to $C_3$, column 314 may correspond to $C_4$, and column 315 may correspond to $C_5$. In an embodiment, the coefficients $C_3$ and $C_4$ may be highly correlated, while the coefficient $C_5$ may have significant descriptive value (e.g., may be useful or necessary for describing the system).

The conventional way of selecting coefficients for the coefficient vector 302 is to increment/decrement the $N_{MP}/M_{MP}$ variables of the data matrix 301. In some embodiments, $M_{MP}$ may correspond to the memory depth of the memory polynomial, and $N_{MP}$ may correspond to the non-linear order of the memory polynomial. For instance, the $N_{MP}$ variable may be incremented to capture additional columns of data, as well as decremented to release columns of data. This conventional technique is limited in that it provides no mechanism for weeding out redundant/correlated data columns residing on intermediate columns/rows (e.g., columns/rows positioned before a column/row that corresponds to a required coefficient). For instance, it may be desirable to remove columns 313 and 314 from the data matrix 301 to remove the redundant/correlated coefficients $C_3$ and $C_4$, thereby lowering the likelihood that the coefficient vector 302 will be over defined. However, when using a conventional approach (i.e., incrementing/decrementing the $N_{MP}/M_{MP}$), removing of the columns 313 and 314 from the data matrix 301 may also require removing all later columns (i.e., including column 315), which would release the highly descriptive coefficient $C_5$ from the coefficient vector 302. As such, the conventional approach to selecting coefficients may not provide a mechanism for selecting the highly descriptive coefficient $C_5$ without also selecting the correlated/redundant coefficients $C_3$ and $C_4$. Hence, the conventional approach to selecting coefficients may be unable to obtain a tight and accurate system model in some instances, e.g., if exclusion of the highly descriptive coefficient $C_5$ produces an under-defined model while inclusion of the correlated/redundant coefficients $C_3$ and $C_4$ produce an over-defined model.

Alternative conventional approaches avoid matrix inversion altogether by computing the coefficient vector directly (i.e., in the inverse domain, rather than in the data domain) using a Least Means Squares (LMS) or Recursive Least Squares (RLS) modeling algorithm. Specifically, the LMS may generally be achieved by using the following formulas to perform an iterative adaptation: $\vec{c}_k = \vec{c}_{k-1} + \mu \epsilon_k \vec{v}_k^*$; and $\epsilon_k = d_k - \vec{c}_{k-1}^T \vec{v}_k$, where $\epsilon_k$ is the estimated error, $d_k$ is the desired signal, $\mu$ is the step size, $\vec{v}_k$ is the input data vector, and $\vec{c}_k$ is the coefficient vector.

Similarly, the RLS may generally be achieved by using the following formulas to perform an iterative adaptation:

$$\varepsilon_k = d_k - \vec{v}_k^T \vec{c}_{k-1};$$

$$\vec{\eta}_k = \frac{P_{k-1} \vec{v}_k^*}{\lambda + \vec{v}_k^T P_{k-1} \vec{v}_k^*};$$

$$P_k = \frac{1}{\lambda}[I_{L+1} - \vec{\eta}_k \vec{v}_k^T] P_{k-1};$$

and $$\vec{c}_k = \vec{c}_{k-1} + \varepsilon_k \vec{\eta}_k,$$

where $\epsilon_k$ is the computed error, $\vec{\eta}_k$ is the computer Kalman gain vector, $P_k$ is the update inverse of the correlation matrix; and $\vec{c}_k$ is the updated coefficient vector.

Conventional approaches that use LMS/RLS algorithms (or other similar algorithms) calculate the coefficient vector ($\vec{c}_k$) directly in the inverse domain. However, because the coefficient vector ($\vec{c}_k$) is computed in the inverse data domain (and is iterative in nature), pruning undesirable coefficients in the data domain is not possible. As such, the computed coefficient vector ($\vec{c}_k$) may nevertheless include redundant/correlated coefficients, and therefore may exhibit a large dynamic range (which undermines stability and produces an overly-complex system model). In other words, conventional techniques relying on LMS/RLS algorithms to compute the coefficient vector do not cure the performance/instability issues that are characteristic of over-defined models. As such, mechanisms and techniques for weeding out redundant or correlated coefficients are desired.

Embodiments of this disclosure include semi-static and dynamic pruning techniques for removing correlated/redundant coefficients from over-defined system models. FIG. 4 illustrates a method 400 of selecting a set of coefficients for modeling a system that includes semi-static pruning. The method 400 begins at step 410, where data may be collected from the system (e.g., the system's output in indirect learning) to form a data matrix ($R_N$), which may correspond to a set of coefficients constituting an over-defined model of the system. Next the method 400 may proceed to step 420, where column sorting may be performed on the data matrix ($R_N$), thereby producing a permutated data matrix ($R_N^{(p)}$). The column sorting may be performed such that a QR decomposition of the permutated data matrix ($R_N^{(p)}$) results in an upper-triangular matrix ($\widetilde{R}_N^p$) having diagonal elements ($\widetilde{r}_{ii}^p$) that are arranged in descending order [$\widetilde{r}_{11}^p \geq \widetilde{r}_{22}^p \geq \ldots \widetilde{r}_{NN}^p$].

Next, the method 400 may proceed to step 430, where one or more columns/rows of the permutated data matrix ($\tilde{R}_N^{(p)}$) (which is an N×N matrix) may be removed to generate a pruned data matrix $\tilde{R}_L^{(p)}$ (which is an L×L matrix, where L<N). The removed rows/columns may be the bottom-most rows and right-most columns of the permutated data matrix ($\tilde{R}_N^{(p)}$).

In one embodiment, the pruned columns/rows of the permutated data matrix ($\tilde{R}_N^{(p)}$) may be those corresponding to highly correlated columns of the upper-triangular matrix ($\tilde{R}_N^{(p)}$), which may be identified according to the formula: $|\tilde{r}_{ii}|/\|\tilde{r}_i\|_2$, where $\tilde{r}_i$ denotes the i-th column. These highly correlated columns may be associated with highly correlated coefficients, which may be effectively pruned (i.e., removed) from the coefficient vector as a direct consequence of pruning the rows/columns of the ($\tilde{R}_N^{(p)}$) that correspond to highly correlated columns of the ($R_N^{(p)}$). In the same or other embodiments, the pruned columns/rows of the permutated data matrix ($\tilde{R}_N^{(p)}$) may be those corresponding to low energy columns of the upper-triangular matrix ($R_N^{(p)}$), which may be identified according to the formula: $\|\tilde{r}_i\|_2$, where $\tilde{r}_i$ denotes the i-th column.

In yet other embodiments, the pruned columns/rows of the permutated data matrix ($\tilde{R}_N^{(p)}$) may be those corresponding to both highly correlated columns of the ($R_N^{(p)}$) and low energy columns of the ($\tilde{R}_N^{(p)}$), which may be identified in accordance with the following formula:

$$\left[\sum_{i=L+1}^{N} |\tilde{r}_{ii}^p|^2 \bigg/ \sum_{i=1}^{N} |\tilde{r}_{ii}^p|^2\right] < p_{th},$$

where $P_{th}$ is a semi-static pruning threshold.

Figure 4A:
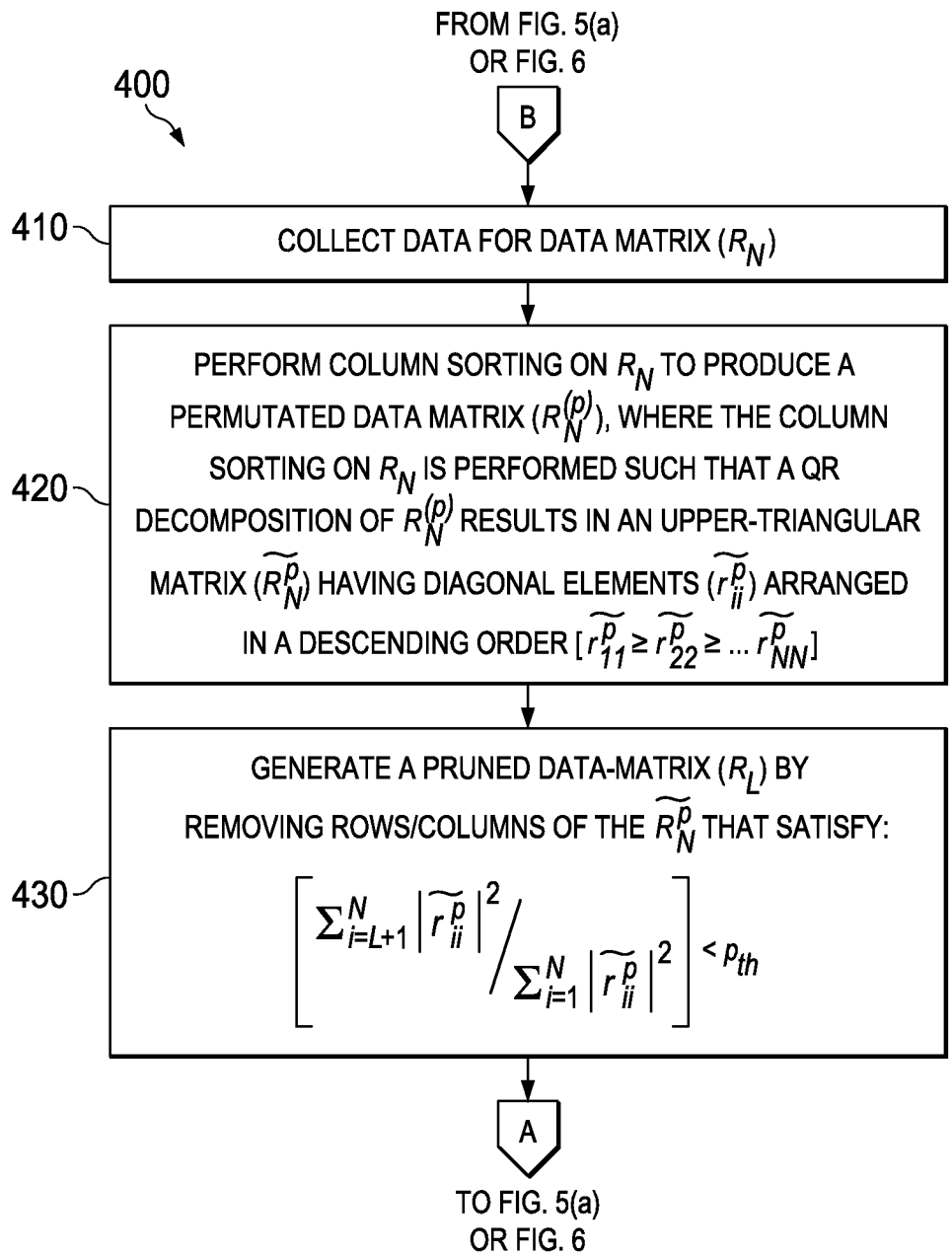
FIG. 4(a) illustrates a flowchart of an embodiment of a method for generating a pruned data matrix that includes semi-static pruning.
Figure 4B:
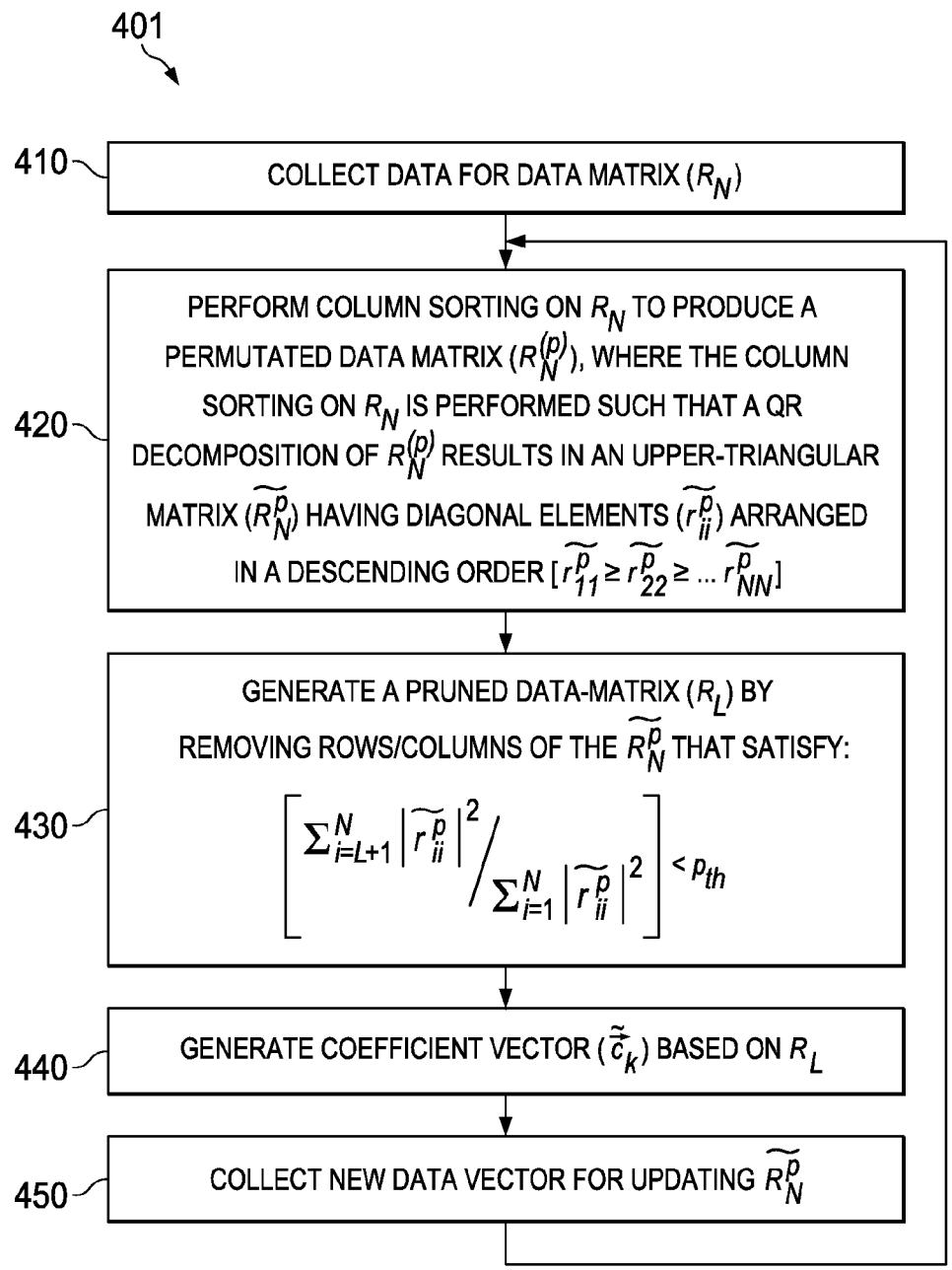
FIG. 4(b) illustrates a flowchart of an embodiment of a method for generating a coefficient vector that includes semi-static pruning.
Figure 5A:
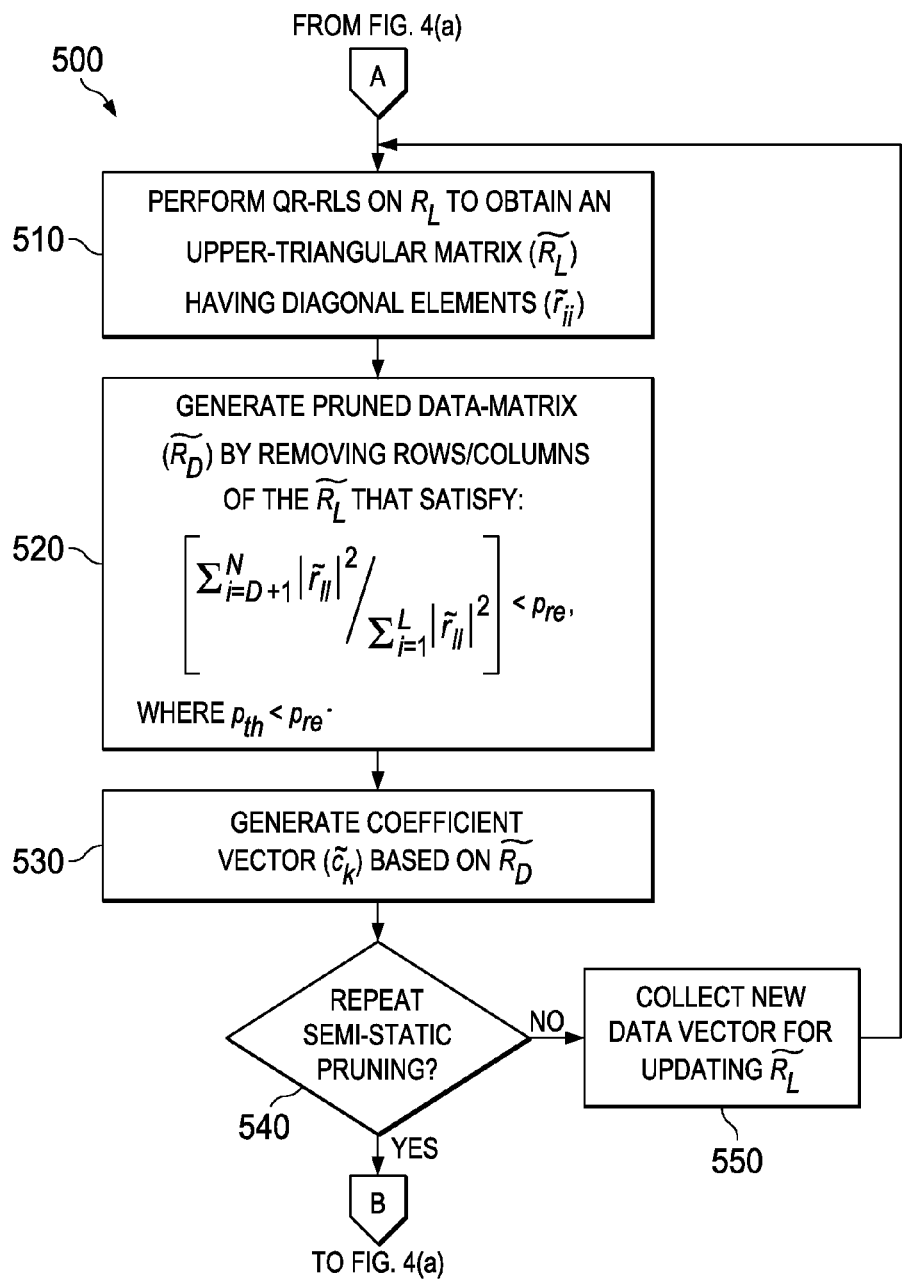
FIG. 5(a) illustrates a flowchart of an embodiment of a method for generating a coefficient vector for modeling a system that includes dynamic pruning.
Figure 6:
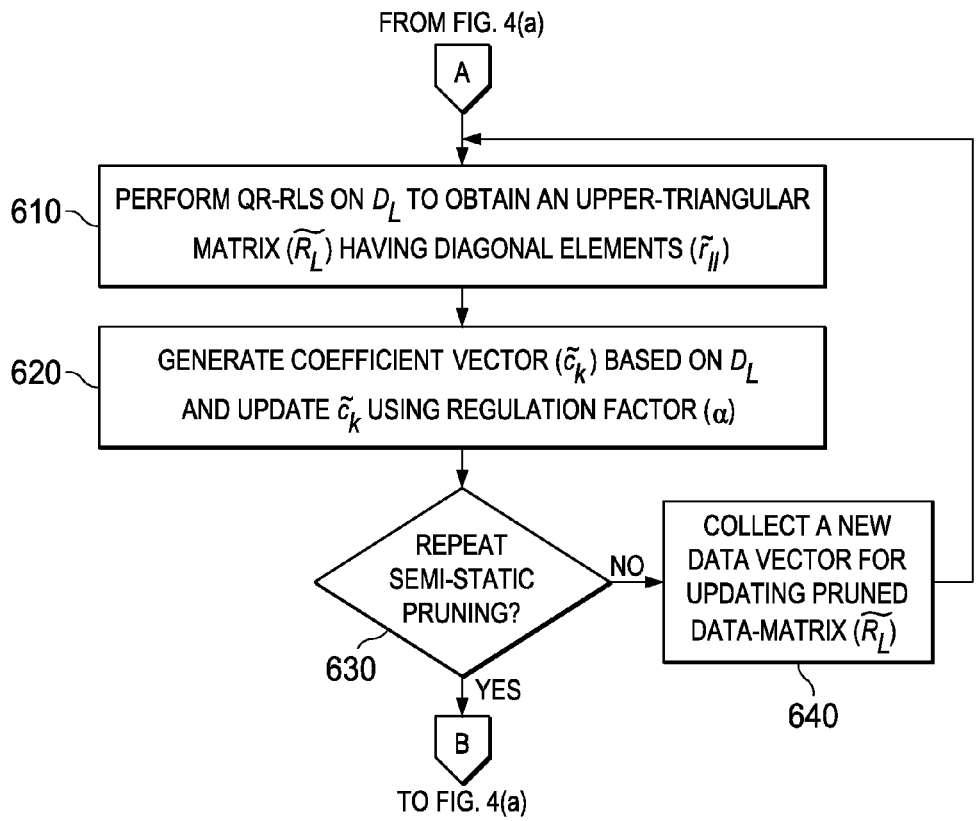
FIG. 6 illustrates a flowchart of a method for generating and performing regularization on a coefficient vector for modeling a system.

In some embodiments, semi-static pruning may be followed by either a dynamic pruning operation (e.g., as depicted in FIG. 5(a)) or a regularization operation (e.g., as depicted in FIG. 6). In other embodiments, semi-static pruning may be performed independently from dynamic-pruning/regularization. FIG. 4(b) illustrates a method 401 of selecting a set of coefficients for modeling a system that includes semi-static pruning. The method 401 is similar in some respects to the method 400 shown in FIG. 4(a), with the exception that the method 401 does not transition to dynamic-pruning or regularization operations depicted in FIGS. 5(a) and 6, respectively. Instead, the method 401 proceeds to step 440 after generating the pruned data matrix, where a coefficient vector ($\vec{c}_k$) is generated in accordance with the pruned data matrix ($R_L$). Thereafter, the method 401 proceeds to step 450, where a new data vector is collected for updating the data matrix. The method 401 then reverts back to step 420. Hence, semi-static pruning is not necessarily semi-static performed semi-statically, but instead may be performed dynamically (e.g., when processing resources or system characteristics allow). In such instances, the semi-static pruning threshold ($p_{th}$) may be set to generate a tight model.

That being said, many implementations may lack the processing resources to perform semi-static pruning each time a coefficients vector (or set of coeffceints) is generated. Specifically, sorting and QR decomposition can be complex and/or computationally expensive, and therefore may be impractical or unfeasible to perform each time coefficients are calculated. Instead, semi-static pruning may be performed on an occasional basis according to long-term statistics. In some embodiments, the semi-static pruning threshold ($p_{th}$) may be selected somewhat conservatively such that the resulting pruned data matrix ($R_L$) relates to a set of coefficients describing a slightly over-defined model. Specifically, the set of desirable coefficients may be time variant such that coefficients that were initially ripe for pruning (e.g., redundant, correlated, low-energy, etc.) become necessary or useful for system modeling at a later time. As such, in some embodiments it is not desirable to generate an overly tight model when semi-static pruning is performed in a static or semi-static manner, as that tight model may become under-defined before the next iteration of semi-static pruning is performed.

In embodiments where semi-static pruning generates a slightly over-defined model, an additional dynamic pruning or regularization step may be useful in achieving a consistently tight model. FIG. 5(a) illustrates an embodiment of a method 500 for dynamic pruning. Unlike semi-static pruning, dynamic pruning does not perform QR decomposition and sorting operations on the data matrix (both of which tend to be computationally expensive). As a result, dynamic pruning may be executed quickly, while consuming fewer computational resources in comparison to semi-static pruning.

The method 500 may begin at step 510, where QR-RLS may be performed on the pruned data matrix ($R_L$) to obtain an upper triangular matrix ($\widetilde{R_L}$) having diagonal elements ($\tilde{r}_{ii}$). Next, the method 500 may proceed to step 520, where a pruned data matrix ($R_D$) may be obtained by removing selected rows/columns of the $R_L$. The pruned rows/columns of the $R_L$ may correspond to low-energy columns and/or highly correlated columns of the upper triangular matrix $\widetilde{R_L}$, which may be identified in accordance with the following formula:

$$\left[\sum_{i=D+1}^{N}|\tilde{r}_{ii}|^2 \Big/ \sum_{i=1}^{L}|\tilde{r}_{ii}|^2\right] < p_{re},$$

where $p_{re}$ is a dynamic pruning threshold.

Next, the method 500 may proceed to step 530, where a coefficient vector ($\bar{c}$) may be generated in accordance with the pruned data matrix ($R_D$). This may include performing matrix inversion on the pruned data matrix ($R_D$). Next, the method 500 may proceed to step 540, where a decision is made as to whether to repeat semi-static pruning prior to the next iteration of coefficient calculation. In one embodiment, this decision may be based on a timeout (e.g., semi-static pruning is performed every so many milliseconds). In other embodiments, this decision may be based on other factors, such as (for instance) a number of iterations of dynamic pruning that have been performed since the most recent iteration of semi-static pruning, e.g., one iteration of semi-static pruning may be performed for every X iterations (10 iterations, 100 iterations, etc.) of dynamic pruning. If it is time to repeat semi-static pruning, the method 500 may terminate at transition B, which may revert back to the method 400 of semi-static pruning as depicted in FIG. 4(a). If it is not time to repeat semi-static pruning, the method 500 may proceed to step 550, where updated data may be collected to form a new data vector. The new data vector is used to update the pruned data matrix, as discussed in greater detail below. After the pruned data matrix has been updated, the method 500 may repeat steps 510-530 until it is time to repeat semi-static pruning.

Figure 5B:
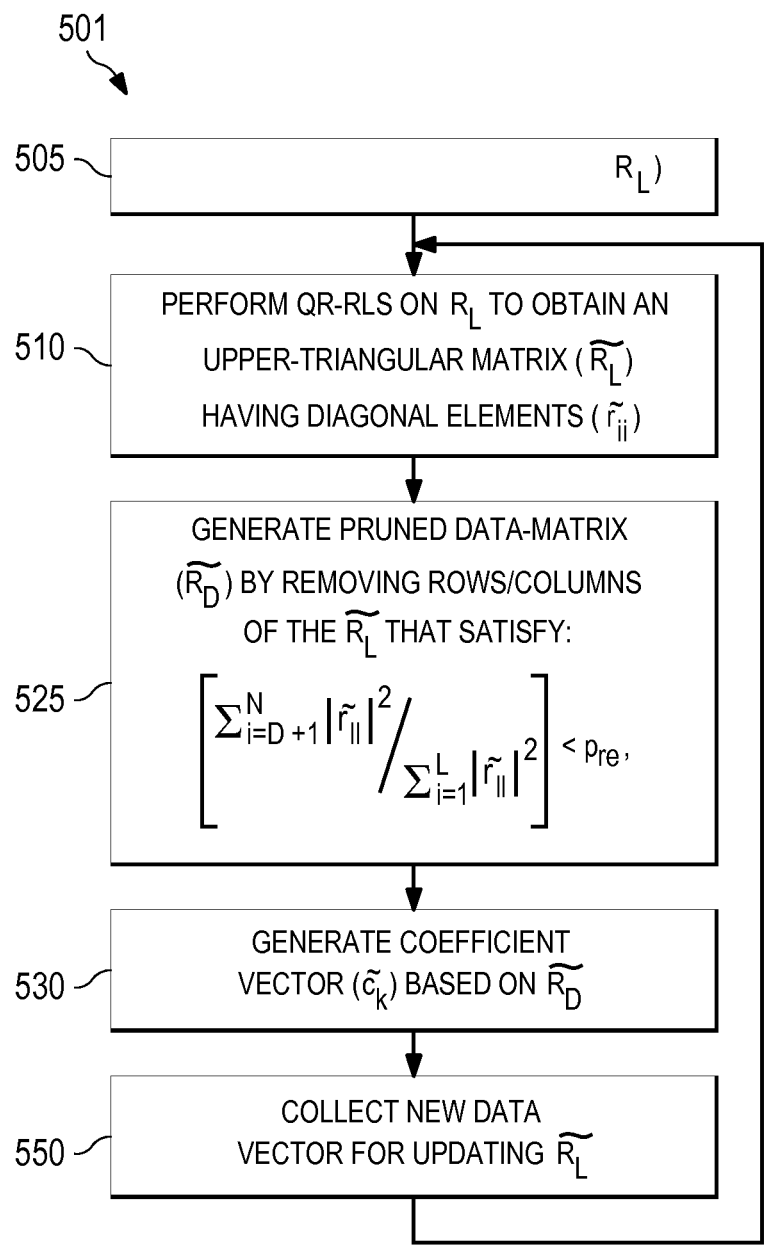
FIG. 5(b) illustrates a flowchart of another embodiment of a method for generating a coefficient vector for modeling a system that includes dynamic pruning.

In some embodiments, dynamic pruning may be performed independently from semi-static pruning (i.e., without being preceded by semi-static pruning). FIG. 5(b) illustrates a method 501 of selecting a set of coefficients for modeling a system that includes dynamic pruning. The method 501 is similar in some respects to the method 500 depicted in FIG. 5(a). However, unlike the method 500, the method 501 does not transition to/from semi-static pruning. Instead, the method 501 begins at step 505, where data is collected to form a data matrix ($R_L$). Next, the method 501 performs steps 510, 525, 530, and 550 (e.g., in a manner similar to that discussed above in FIG. 5(a), with the exception that the method 501 does not include a step 540). Thereafter, the method 501 reverts back to step 510.

In some embodiments, regularization may be used (e.g., instead of or in addition to dynamic pruning) to control the dynamic range of coefficients in an adaptive system. For instance, a leaky LMS algorithm regularization technique is described in Adaptive Filter Theory ($3^{rd}$ edition) by S. Haykin, Prentice Hall (1996), which is incorporated herein by reference as if reproduced in its entirety.

FIG. 6 illustrates a method 600 for performing regularization on the pruned data matrix ($D_L$). The method 600 begins at step 610, where QR-RLS is performed on the pruned data matrix ($D_L$) to obtain an upper-triangular matrix ($\widetilde{R_L}$) having diagonal elements ($\tilde{r}_{ii}$). Next, the method 600 proceeds to step 620, where a coefficient vector ($\bar{c}$) is generated based on the $D_L$, and then updated using regulation factor ($\alpha$). Thereafter, the method 600 proceeds to step 630, where a decision is made as to whether to repeat semi-static pruning prior to the next iteration of coefficient computation/regularization. If semi-static pruning is to be repeated prior to the next iteration of coefficient computation/regularization, then the method 600 proceeds to transition B. Otherwise (if semi-static pruning is not to be repeated at this time), then the method 600 proceeds to step 640, where updated data may be collected to form a new data vector. The new data vector may be used to update the pruned data matrix ($D_L$) prior to another round of coefficient computation/regularization (i.e., prior to repeating steps 610-620 are repeated).

Figure 7:
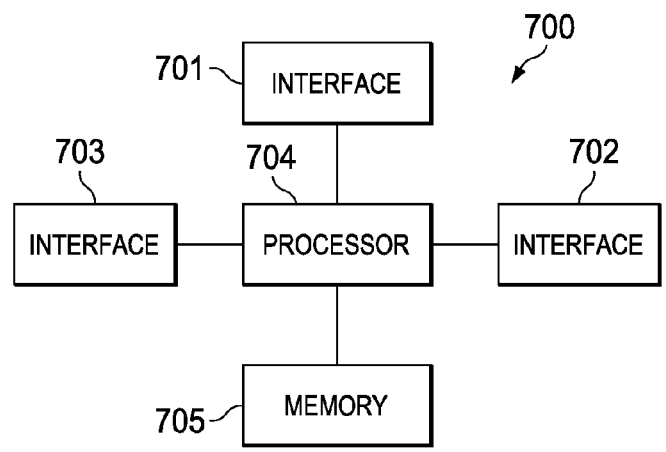
FIG. 7 illustrates a block diagram of a processing module.

FIG. 7 illustrates a diagram of a module 700, which may be including in a modeling component (e.g., a DPD circuit, or otherwise) to implement aspects of this disclosure. The module 700 comprise a plurality of interfaces 702-703, a processor 704, and a memory 705. The interfaces 701-703 may be used for a variety of purposes, including to gather data from a system (e.g., output/input signal probing of a PA, etc.), as well as to introduce to a feedback or correction signal into a system (e.g., to introduce an inverse distortion signal, etc.). The processor 704 may be any component capable of performing computations and/or other processing related tasks, and the memory 705 may be any component capable of storing programming and/or instructions for the processor.

The following is a mathematical explanation of semi-static pruning, dynamic pruning, and regularization, and is intended to further the readers understanding of the above discussed principles. Notably, QR-RLS (as performed during dynamic pruning and regularization) can be performed to compute the coefficient vector in accordance with the following equations:

$$Q_k \begin{bmatrix} \sqrt{\lambda} R_{k-1} & \sqrt{\lambda} \vec{\eta}_{k-1} \\ \vec{v}_k^T & d_k \end{bmatrix} = \begin{bmatrix} R_k & \vec{\eta}_k \\ \overline{0}^T & \xi_k \end{bmatrix};$$

$$\vec{c}_k = R_k^{-1} \vec{\eta}_k,$$

where $Q_k$ is a unitary matrix, and $R_k$ is up-triangular.

Notably, QR-RLS differs from the conventional LMS/RLS algorithms in that the coefficient vector ($\vec{c}_k$) is calculated from the inverse of the data matrix which propagates from iteration to iteration (rather than iteratively from the previously computed coefficient vector ($\vec{c}_{k-1}$). By computing the coefficient vector ($\vec{c}_k$) from the data domain, columns/rows of a permutated data matrix (i.e., a sorted version of the data matrix) can be removed to effectively prune highly correlated coefficients from the $\vec{c}_k$. For semi-static pruning, the second QR-RLS equation can be rewritten in a form that is suitable for pruning: $R_k \vec{c}_k = \eta_k$. Next, column sorting can be performed on the data matrix ($R_k$)) to obtain a permuted data matrix ($R_k^{(p)}$). The sorting may be performed such that a QR decomposition of the permuted data matrix ($R_k^{(p)}$) produces an upper-right triangular matrix ($\widetilde{R_k^p}$) that has diagonal elements ($\widetilde{r_{ii}^p}$) arranged in a descending order [$\widetilde{r_{11}^p} \geq \widetilde{r_{22}^p} \geq \ldots \widetilde{r_{NN}^p}$]. As used herein, upper-triangular matrices may be synonymous with upper triangular matrices and/or right triangular matrices. Specifically, the equation [$R_k^{(p)} = \Theta_k \tilde{R}_k^{(p)}$] is used to perform QR decomposition on the permuted data matrix ($R_k^{(p)}$), and may be rewritten as $\tilde{R}_k^{(p)} \vec{c}_k^{(p)} = \Theta_k^H \vec{\eta}_k$, where $\vec{c}_k^{(p)}$ is a permuted coefficient vector. Notably, the $\vec{c}_k^{(p)}$ is generated by sorting the elements of $\vec{c}_k$ according to the permutation pattern used to sort the columns of $R_k$ (i.e., the permutation patterns used to generate $\vec{c}_k^{(p)}$ and $R_k^{(p)}$) are identical). Further, irrespective of the permutation pattern used, the Euclidian norm of $\widetilde{R_k^p}$ and $R_k$ remains constant (i.e., $\Pi|\widetilde{r_{ii}^p}| = \Pi|\tilde{r}_{ii}|$). However, sorting may maximize the $$\sum_i |\tilde{r}_{ii}^{(p)}|,$$

which is desirable in so far as it ensures that the pruned coefficients are the weakest in terms of corresponding data energy.

If it is assumed that the set S contains the selected coefficients, that cardinality is maintained, and that sorting maximizes $$\prod_{i \in S} |\tilde{r}_{ii}^{(p)}|.$$

Accordingly, a large $|\tilde{r}_{ii}^{(p)}|$ suggests a corresponding coefficient is sufficiently independent and reliable. If the norm of the $i^{th}$ column of $\tilde{R}_k^{(p)}$ is denoting as $\|\tilde{\mathrm{f}}_i^{(p)}\|$, then the resulting equation is as follows: $\tilde{r}_{ii}^{(p)} = \|\tilde{\mathrm{f}}_i^{(p)}\|(\tilde{r}_{ii}^{(p)}/\|\tilde{\mathrm{f}}_i^{(p)}\|)$, where $\|\tilde{\mathrm{f}}_i^{(p)}\|^2$ represents the energy of the data corresponding to the coefficient $\tilde{c}_i$, and $(\tilde{r}_{ii}^{(p)}/\|\tilde{\mathrm{f}}_i^{(p)}\|)$ represents the level of correlation of $\tilde{c}_i$ to the coefficients $\tilde{c}_j$, $j<i$.

Notably, the correlation between $\tilde{c}_i$ and $\tilde{c}_j$ (where $j<i$) is inversely proportional to $(\tilde{r}_{ii}^{(p)})/\|\tilde{\mathrm{f}}_i^{(p)}\|$). Hence, a small $|\tilde{r}_{ii}^{(p)}|$ may be the result of small energy (i.e. $\|\tilde{\mathrm{f}}_i^{(p)}\|$), high correlation (i.e. small $(\tilde{r}_{ii}^{(p)}/\|\tilde{\mathrm{f}}_i^{(p)}\|)$), or both.

A QR decomposition of the permuted data matrix ($R_k^{(p)}$) may create an upper-right triangular matrix as follows:

$$\tilde{R}_k^{(p)} = \begin{bmatrix} \tilde{r}_{11}^{(p)} & \tilde{r}_{12}^{(p)} & \ldots & \tilde{r}_{1N}^{(p)} \\ 0 & \tilde{r}_{22}^{(p)} & \ldots & \tilde{r}_{2N}^{(p)} \\ \vdots & \vdots & \ddots & \vdots \\ 0 & 0 & \ldots & \tilde{r}_{NN}^{(p)} \end{bmatrix},$$

where $|\tilde{r}_{11}^{(p)}| \geq |\tilde{r}_{22}^{(p)}| \geq \ldots \geq |\tilde{r}_{NN}^{(p)}|$.

Thereafter, pruning the rightmost columns and bottommost rows from $\tilde{R}_k^{(p)}$ may effectively prune the bottommost coefficients from $\vec{c}_k^{(p)}$. A threshold for semi-static pruning may be set so that first L rows and columns of $\tilde{R}_k^{(p)}$ are kept, and the pruning may be performed according to $$\frac{\sum_{i=L+1}^{N} |\tilde{r}_{ii}^{(p)}|^2}{\sum_{i=1}^{N} |\tilde{r}_{ii}^{(p)}|^2} < \rho_{th} \text{ or } |\tilde{r}_{ii}^{(p)}| < \rho_{th}.$$

Semi-static pruning achieves a new set of lean equations, which appear as follows:

$$\begin{bmatrix} \tilde{r}_{11}^{(p)} & \tilde{r}_{12}^{(p)} & \ldots & \tilde{r}_{1L}^{(p)} \\ 0 & \tilde{r}_{22}^{(p)} & \ldots & \tilde{r}_{2L}^{(p)} \\ \vdots & \vdots & \ddots & \vdots \\ 0 & 0 & \ldots & \tilde{r}_{LL}^{(p)} \end{bmatrix} \begin{bmatrix} c_1^{(p)} \\ c_2^{(p)} \\ \vdots \\ c_L^{(p)} \end{bmatrix} = \begin{bmatrix} \tilde{\eta}_1 \\ \tilde{\eta}_2 \\ \vdots \\ \tilde{\eta}_L \end{bmatrix},$$

where $\tilde{\eta}_k = \Theta_k^H \widetilde{r_{ii}^p}_k$, and N−L is the number of coefficients pruned. Notably, while $R_k$ and $\vec{c}_k$ are permutated, $\widetilde{r_{ii}^p}_k$ is not.

Due to their complexity, sorting and QR decomposition may be impractical to perform every time coefficients are calculated. Hence, semi-static pruning (which includes sorting and QR decomposition) may be performed statically or semi-statically, and may be followed by a number of iterations of dynamic pruning and/or dynamic regularization. Notably, semi-static pruning may reduce the computation complexity (as well as the complexity of dynamic pruning and/or regularization), which may be inversely proportional to the number of coefficients (L), e.g., complexity $\propto L^2$.

Regularization may be used to control the dynamic range of the coefficients in a Leaky LMS based system according to the following formula: $\vec{c}_k = (1-\alpha\mu)\vec{c}_{k-1} + \mu\epsilon_k \vec{v}_k^*$, where $\alpha$ is the regularization factor. Hence, the following statement results:

$$\lim_{k \to \infty} E(\vec{c}_k) = (G + \alpha I)^{-1} \vec{p},$$

where $G = E(\vec{v}_k^* \vec{v}_k)$ is the correlation matrix of the input signal vectors, and $\vec{p} = E(d_k \vec{v}_k^*)$ is the cross-correlation vector between the input vectors and the desired response. From this, the function of the leaky LMS algorithm results: $J_k = |\epsilon_k|^2 + \alpha \|\vec{c}_k\|^2$.

As shown, the purpose of the leaky LMS algorithm is to control the dynamic range of the coefficient vector $\vec{c}_k$. The larger the normalization factor α, the more weight is put on controlling the dynamic range of $\vec{c}_k$. Hence, a large α will shift the optimization away from minimizing $|\epsilon_k|^2$ to minimizing $\|\vec{c}_k\|^2$, which may degrade performance due to residual error.

A least squares version of the regularization algorithm is explained in the IEEE article "Optimized Low-Complexity Implementation of Least Squares Based Model Extraction for Digital Predistortion of RF Power Amplifiers", by L. Guan and A. Zhu, IEEE Transactions on Microwave Theory and Techniques, vol. 60, no. 3, pp. 594-603, March 2012, which is incorporated herein by reference as if reproduced in its entirety. As described therein the following function may be used to calculate the coefficient vector: $\vec{c}_k = (V_k^H V_k + \alpha I) V_k^H \vec{d}_k$.

Regularization can be implemented in the back-substitution stage of QR-RLS. For example, $c_i^{(p)}$ can be calculated using the following formula:

$$c_i^{(p)} = \frac{1}{\tilde{r}_{ii}^{(p)}} \left( \tilde{\eta}_i - \sum_{j>i} \tilde{r}_{ij}^{(p)} c_j^{(p)} \right).$$

As such, regularization can be modified according to the following formula:

$$c_i^{(p)} = \frac{(\tilde{r}_{ii}^{(p)})^*}{\tilde{r}_{ii}^{(p)}(\tilde{r}_{ii}^{(p)})^* + \alpha} \left( \tilde{\eta}_i - \sum_{j>i} \tilde{r}_{ij}^{(p)} c_j^{(p)} \right).$$

This formula may be further simplified to $$c_i^{(p)} \cong \frac{1}{\tilde{r}_{ii}^{(p)} + \alpha} \left( \tilde{\eta}_i - \sum_{j>i} \tilde{r}_{ij}^{(p)} c_j^{(p)} \right)$$

without significantly degrading performance.

Although present embodiments and their advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof.

Embodiments of this disclosure provide a digital pre-distortion (DPD) circuit comprising: a first port coupled to an output of a non-linear power amplifier (PA); a second port coupled to an input of the non-linear PA; a processor; and a computer readable storage medium storing programming for execution by the processor, the programming including instructions to: form a data matrix comprising data obtained from an output signal received on the first port; generate an upper triangular matrix in accordance with the data matrix; prune the upper triangular matrix to remove selected rows and columns from the upper triangular matrix, thereby generating a pruned data matrix; determine an inverse distortion signal in accordance with the pruned data matrix; and output the inverse distortion signal over the second port, thereby compensating for non-linearity in the non-linear PA.

In an embodiment, the DPD circuit may further include instructions to generate the upper triangular matrix in accordance with the data matrix includes instructions to perform a QR-Recursive-Least-Squares (QR-RLS) operation on the data matrix to obtain the upper triangular matrix.

In an embodiment, the upper triangular matrix may comprise a plurality of diagonal elements, and the instructions to prune the upper triangular matrix include instructions to: identify one or more rightmost columns of the upper triangular matrix comprising diagonal elements that are smaller than a threshold diagonal element ($\widetilde{r_{II}^p}$), wherein the threshold diagonal element is determined in accordance with the following formula:

$$\left[ \frac{\sum_{i=L+1}^{N} |\tilde{r}_{ii}|^2}{\sum_{i=1}^{N} |\tilde{r}_{ii}|^2} \right] < p_{th},$$

where $\widetilde{r_{ii}^p}$ is a given diagonal element of the upper triangular matrix having an N-by-N dimension, and where $p_{th}$ is a pruning threshold.

Embodiments of this disclosure also provide a digital pre-distortion (DPD) circuit comprising: a first port coupled to an output of a non-linear power amplifier (PA); a second port coupled to an input of the non-linear PA; a processor; and a computer readable storage medium storing programming for execution by the processor, the programming including instructions to: form a data matrix from an output signal received on the first port; perform column sorting on the data matrix to produce a permutated data matrix; perform QR decomposition on the permutated data matrix to produce an upper triangular matrix; prune the upper triangular matrix to remove selected rows and columns from the upper triangular matrix, thereby generating a pruned data matrix; determine an inverse distortion signal in accordance with a derivative of the pruned data matrix; and output the inverse distortion signal over the second port, thereby compensating for non-linearity in the non-linear PA.

In an embodiment, the instructions to perform column sorting on the data matrix include instructions to perform column sorting on the data matrix such that columns of the permutated data matrix are arranged in descending order in accordance with their respective energy levels.

In an embodiment, the instructions to prune the upper triangular matrix include instructions to remove one or more rightmost columns of the upper triangular matrix that are highly correlated with remaining leftmost columns of the upper triangular matrix.

In an embodiment, the instructions to perform column sorting on the data matrix include instructions to sort columns of the data matrix such that a QR decomposition of the permutated data matrix produces the upper triangular matrix having a plurality of diagonal elements that are arranged in descending order [$\widetilde{r_{11}^p} \geq \widetilde{r_{22}^p} \geq \ldots \geq \widetilde{r_{NN}^p}$].

In an embodiment, the instructions to prune the upper triangular matrix include instructions to: remove one or more rightmost columns of the upper triangular matrix comprising diagonal elements that are smaller than a threshold diagonal element ($\widetilde{r_{LL}^p}$), the threshold diagonal element being determined in accordance with the following formula:

$$\left[\frac{\sum_{i=L+1}^{N}|\tilde{r}_{ii}|^2}{\sum_{i=1}^{N}|\tilde{r}_{ii}|^2}\right]<p_{th},$$

where $\tilde{r}_{ii}^p$ is a given diagonal element of the upper triangular matrix having an N-by-N dimension, and where $p_{th}$ is a semi-static pruning threshold.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of selecting coefficients for modeling a system, the method comprising:
    receiving data collected from a power amplifier, the power amplifier exhibiting a non-linear gain characteristic, wherein a distortion circuit introduces an inverse distortion signal into an input of the power amplifier;
    forming a data matrix comprising the data collected from the power amplifier;
    generating an upper triangular matrix in accordance with the data matrix, the upper triangular matrix comprising a plurality of diagonal elements;
    pruning the upper triangular matrix to remove one or more columns of the upper triangular matrix comprising diagonal elements that are smaller than a threshold diagonal element, thereby generating a pruned data matrix;
    generating a coefficient vector in accordance with the pruned data matrix;
    generating an inverse distortion signal from the coefficient vector; and
    introducing the inverse distortion signal into the input of the power amplifier.

2. The method of claim 1, wherein generating the upper triangular matrix in accordance with the data matrix includes performing a QR-Recursive-Least-Squares (QR-RLS) operation on the data collected from the system to obtain the upper triangular matrix.

3. The method of claim 1, wherein the threshold diagonal element is determined in accordance with the following formula:

$$\left[\frac{\sum_{i=L+1}^{N}|\tilde{r}_{ii}|^2}{\sum_{i=1}^{N}|\tilde{r}_{ii}|^2}\right]<p_{th},$$

where $\tilde{r}_{ii}^p$ is a given diagonal element of the upper triangular matrix having an N-by-N dimension, and where $p_{th}$ is a pruning threshold.

4. An apparatus comprising:
    a processor; and
    a computer readable storage medium storing programming for execution by the processor, the programming including instructions to:
        receive data collected from a power amplifier, the power amplifier exhibiting a non-linear gain characteristic, wherein a distortion circuit introduces an inverse distortion signal into an input of the power amplifier;
        form a data matrix comprising the data collected from a system, the upper triangular matrix comprising a plurality of diagonal elements;
        generate an upper triangular matrix in accordance with the data matrix;
        prune the upper triangular matrix to remove one or more columns of the upper triangular matrix comprising diagonal elements that are smaller than a threshold diagonal element, thereby generating a pruned data matrix;
        generate a coefficient vector in accordance with the pruned data matrix;
        generate an inverse distortion signal from the coefficient vector; and
        introduce the inverse distortion signal into the input of the power amplifier.

5. The apparatus of claim 4, wherein the instructions to generate the upper triangular matrix in accordance with the data matrix include instructions to perform a QR-Recursive-Least-Squares (QR-RLS) operation on the data matrix to obtain the upper triangular matrix.

6. The apparatus of claim 4, wherein the instructions to prune the upper triangular matrix include instructions to determine the threshold diagonal element in accordance with the following formula:

$$\left[\frac{\sum_{i=L+1}^{N}|\tilde{r}_{ii}|^2}{\sum_{i=1}^{N}|\tilde{r}_{ii}|^2}\right]<p_{th},$$

where $\tilde{r}_{ii}^p$ is a given diagonal element of the upper triangular matrix having an N-by-N dimension, and where $p_{th}$ is a pruning threshold.

7. A method of selecting coefficients for modeling a system, the method comprising:
    collecting data from a power amplifier to form a data matrix, the power amplifier exhibiting a non-linear gain characteristic, wherein a distortion circuit introduces an inverse distortion signal into an input of the power amplifier;
    performing column sorting on the data matrix to produce a permutated data matrix;
    performing QR decomposition on the permutated data matrix to produce an upper triangular matrix, the upper triangular matrix comprising a plurality of diagonal elements;
    pruning the upper triangular matrix to remove one or more columns of the upper triangular matrix that are highly correlated with remaining leftmost columns of the upper triangular matrix, thereby generating a pruned data matrix;
    generating a coefficient vector in accordance with a derivative of the pruned data matrix;
    generating an inverse distortion signal from the coefficient vector; and
    introducing the inverse distortion signal into the input of the power amplifier.

8. The method of claim 7, wherein column sorting is performed on the data matrix such that columns of the permutated data matrix are arranged in descending order in accordance with their respective energy levels such that rightmost columns have lower energy levels than leftmost columns.

9. The method of claim 7, wherein the upper triangular matrix has a plurality of diagonal elements that are arranged in descending order [$\widetilde{r^p_{11}} \geq \widetilde{r^p_{22}} \geq \ldots \widetilde{r^p_{NN}}$].

10. The method of claim 9, wherein pruning the upper triangular matrix comprises:
removing one or more columns of the upper triangular matrix comprising diagonal elements that are smaller than a threshold diagonal element, wherein the threshold diagonal element is determined in accordance with the following formula:

$$\left[\frac{\sum_{i=L+1}^{N} |\widetilde{r}_{ii}|^2}{\sum_{i=1}^{N} |\widetilde{r}_{ii}|^2}\right] < p_{th},$$

where $\widetilde{r^p_{ii}}$ is a given diagonal element of the upper triangular matrix having an N-by-N dimension, and where $p_{th}$ is a semi-static pruning threshold.

11. The method of claim 7, wherein the data matrix is an N-by-N square matrix (where N is an integer greater than zero),
wherein the pruned matrix is an L-by-L square matrix (where L is an integer greater than zero but less than N), and
wherein the derivative of the pruned matrix is a D-by-D square matrix (where D is an integer greater than zero but less than L).

12. The method of claim 7 further comprising:
performing dynamic pruning on the pruned data matrix to produce the derivative of the pruned data matrix, wherein column sorting is not performed during the dynamic pruning step.

13. The method of claim 12 further comprising:
iteratively updating the model of the system subsequent to producing the coefficient vector, wherein iteratively updating the model of the system includes dynamic pruning operations, but excludes column sorting operations and QR decomposition operations.

14. The method of claim 7 further comprising performing regularization on the pruned data matrix to produce the derivative of the pruned data matrix.

15. An apparatus comprising:
a processor; and
a computer readable storage medium storing programming for execution by the processor, the programming including instructions to:
collect data from a power amplifier to form a data matrix, the power amplifier exhibiting a non-linear gain characteristic, wherein a distortion circuit introduces an inverse distortion signal into an input of the power amplifier;
perform column sorting on the data matrix to produce a permutated data matrix;
perform QR decomposition on the permutated data matrix to produce an upper triangular matrix, the upper triangular matrix comprising a plurality of diagonal elements;
prune the upper triangular matrix to remove one or more columns of the upper triangular matrix that are highly correlated with remaining columns of the upper triangular matrix, thereby generating a pruned data matrix;
generate a coefficient vector in accordance with a derivative of the pruned data matrix
generate an inverse distortion signal from the coefficient vector; and
introduce the inverse distortion signal into the input of the power amplifier.

16. The apparatus of claim 15, wherein the instructions to perform column sorting on the data matrix include instructions to perform column sorting on the data matrix such that columns of the permutated data matrix are arranged in descending order in accordance with their respective energy levels.

17. The apparatus of claim 15, wherein the upper triangular matrix includes a plurality of diagonal elements that are arranged in descending order [$\widetilde{r^p_{11}} \geq \widetilde{r^p_{22}} \geq \ldots \widetilde{r^p_{NN}}$].

18. The apparatus of claim 17, wherein the instructions to prune the upper triangular matrix include instructions to:
remove one or more rightmost columns of the upper triangular matrix comprising diagonal elements that are smaller than a threshold diagonal element, the threshold diagonal element being determined in accordance with the following formula:

$$\left[\frac{\sum_{i=L+1}^{N} |\widetilde{r}_{ii}|^2}{\sum_{i=1}^{N} |\widetilde{r}_{ii}|^2}\right] < p_{th},$$

where $\widetilde{r^p_{ii}}$ is a given diagonal element of the upper triangular matrix having an N-by-N dimension, and where $p_{th}$ is a semi-static pruning threshold.

19. The apparatus of claim 15, wherein the data matrix is an N-by-N square matrix (where N >0), the pruned matrix is an L-by-L square matrix (where N >L >0), and the derivative of the pruned matrix is a D-by-D square matrix (where L >D >0).

20. The apparatus of claim 15, wherein the instructions to prune the upper triangular matrix include instructions to remove one or more rightmost columns of the upper triangular matrix.

21. The apparatus of claim 15, wherein the highly correlated columns of the upper-triangular matrix are identified according to the following formula: $|\widetilde{r}_{ii}|/\|\widetilde{r}_i\|_2$, where $\widetilde{r^p_{ii}}$ denotes the i-th column, and $|\widetilde{r}_{ii}|$ denotes a diagonal element of the i-th column.

22. The method of claim 7, wherein pruning the upper triangular matrix comprises removing one or more rightmost columns of the upper triangular matrix.

23. The method of claim 7, wherein the highly correlated columns of the upper-triangular matrix are identified according to the following formula: $|\widetilde{r}_{ii}|/\|\widetilde{r}_i\|_2$, where $\widetilde{r}_i$ denotes the i-th column, and $|\widetilde{r}_{ii}|$ denotes a diagonal element of the i-th column.

24. The method of claim 1, wherein pruning the upper triangular matrix comprises removing one or more rightmost columns of the upper triangular matrix comprising diagonal elements that are smaller than the threshold diagonal element.

* * * * *

UNITED STATES PATENT AND TRADEMARK OFFICE
CERTIFICATE OF CORRECTION

PATENT NO.        : 9,245,072 B2
APPLICATION NO.   : 13/732173
DATED             : January 26, 2016
INVENTOR(S)       : Ming Jia Page 1 of 1

It is certified that error appears in the above-identified patent and that said Letters Patent is hereby corrected as shown below:

Claims

In Col. 16, line 52, claim 21, delete " $\overline{r_{ii}^{p}}$ " and insert -- $\widetilde{\overline{r_i}}$ --.

Signed and Sealed this
Twenty-sixth Day of April, 2016

Michelle K. Lee
*Director of the United States Patent and Trademark Office*